(12) United States Patent
He et al.

(10) Patent No.: US 10,465,894 B2
(45) Date of Patent: Nov. 5, 2019

(54) OPTICAL MODULE

(71) Applicants: Hisense Broadband Multimedia Technologies Co., Ltd., Qingdao (CN); Hisense Broadband Multimedia Technologies, Ltd., Tortola (VG)

(72) Inventors: Peng He, Qingdao (CN); Haiqiang Xu, Qingdao (CN); Sigeng Yang, Qingdao (CN); Shuai Zhang, Qingdao (CN)

(73) Assignees: Hisense Broadband Multimedia Technologies Co., Ltd., Qingdao, Shandong (CN); Hisense Broadband Multimedia Technologies, Ltd., Tortola (VG)

( * ) Notice: Subject to any disclaimer, the term of this patent is extended or adjusted under 35 U.S.C. 154(b) by 302 days.

(21) Appl. No.: 15/394,494

(22) Filed: Dec. 29, 2016

(65) Prior Publication Data

US 2017/0370569 A1 Dec. 28, 2017

(30) Foreign Application Priority Data

Jun. 28, 2016 (CN) .......................... 2016 1 0496308

(51) Int. Cl.
*F21V 29/503* (2015.01)
*F21V 29/70* (2015.01)
(Continued)

(52) U.S. Cl.
CPC .............. *F21V 29/503* (2015.01); *F21V 5/04* (2013.01); *F21V 23/005* (2013.01); *F21V 29/70* (2015.01); *G02B 6/4281* (2013.01); *H05K 1/147* (2013.01); *H05K 1/189* (2013.01); *F21V 15/01* (2013.01); *G02B 6/4272* (2013.01); *H05K 1/0203* (2013.01); *H05K 1/0274* (2013.01);
(Continued)

(58) Field of Classification Search
CPC .......... F21V 29/503; F21V 29/70; F21V 5/04; G02B 6/4281; H05K 1/147; H05K 1/189
See application file for complete search history.

(56) References Cited

U.S. PATENT DOCUMENTS 4,858,071 A 8/1989 Manabe et al.
5,345,205 A 9/1994 Kornrumpf
(Continued)

FOREIGN PATENT DOCUMENTS

CN 1158689 A 9/1997
CN 201150132 Y 11/2008
(Continued)

OTHER PUBLICATIONS

Extended European Search Report dated Aug. 30, 2017 for European Application No. 16206961.1, 10 pages.
(Continued)

*Primary Examiner* — Robert J May
*Assistant Examiner* — Leah Simone Macchiarolo
(74) *Attorney, Agent, or Firm* — Brinks Gilson & Lione

(57) ABSTRACT

An optical module is provided in the present disclosure. According to an embodiment, the optical module may comprise a housing, two or more circuit board layers, and a light emitting chip. The two or more circuit board layers may be disposed in the housing and electrically connected to each other; and the light emitting chip may be electrically connected to at least one of the circuit board layers.

20 Claims, 9 Drawing Sheets

(51) Int. Cl.
*F21V 5/04* (2006.01)
*F21V 23/00* (2015.01)
*G02B 6/42* (2006.01)
*H05K 1/14* (2006.01)
*H05K 1/18* (2006.01)
*F21V 15/01* (2006.01)
*H05K 1/02* (2006.01)
*H05K 3/00* (2006.01)

(52) U.S. Cl.
CPC ..... *H05K 3/0061* (2013.01); *H05K 2201/042* (2013.01); *H05K 2201/10121* (2013.01)

(56) References Cited

U.S. PATENT DOCUMENTS

| | | | |
|---|---|---|---|
| 6,692,159 B2 | 2/2004 | Chiu et al. | |
| 7,378,596 B2* | 5/2008 | Kawaguchi | H05K 3/4691 174/255 |
| 7,637,672 B1 | 12/2009 | Li et al. | |
| 7,642,466 B2* | 1/2010 | Nikaido | H05K 1/148 174/250 |
| 7,931,771 B2* | 4/2011 | Watanabe | H01J 9/52 156/247 |
| 8,093,502 B2* | 1/2012 | Mikado | H05K 1/0281 174/254 |
| 8,178,789 B2* | 5/2012 | Takahashi | H05K 3/4691 174/261 |
| 8,396,370 B2 | 3/2013 | Mu | |
| 8,861,205 B2* | 10/2014 | Lee | H05K 1/145 361/749 |
| 2002/0114143 A1 | 8/2002 | Morrison et al. | |
| 2007/0196044 A1* | 8/2007 | Nagura | H01L 25/167 385/14 |
| 2008/0074853 A1* | 3/2008 | Jang | H05K 1/189 361/749 |
| 2009/0166065 A1* | 7/2009 | Clayton | H05K 1/189 174/254 |
| 2010/0091501 A1 | 4/2010 | Tan et al. | |
| 2010/0129083 A1* | 5/2010 | Mu | G02B 6/4201 398/135 |
| 2012/0120619 A1* | 5/2012 | Kodera | H05K 1/0219 361/749 |
| 2015/0316810 A1* | 11/2015 | Shibahara | G02F 1/1333 349/150 |
| 2016/0161770 A1* | 6/2016 | Joo | G02F 1/0102 359/241 |
| 2017/0006738 A1* | 1/2017 | Lee | G02F 1/13452 |

FOREIGN PATENT DOCUMENTS

| | | |
|---|---|---|
| CN | 105493169 A | 4/2016 |
| FR | 2 754 416 | 4/1998 |
| JP | H05145815 | 6/1993 |

OTHER PUBLICATIONS

Second Office Action and Search Report received from the State Intellectual Property Office of People's Republic of China for Application No. 201610496308.9 dated Jun. 20, 2018 (with English translation) (14 pp.).

Office Action and Search Report received from the State Intellectual Property Office of People's Republic of China for Application No. 201610496308.9 dated Dec. 25, 2017 (with English translation) (6 pp.).

* cited by examiner

OPTICAL MODULE

CROSS-REFERENCE TO RELATED APPLICATIONS

The application claims priority to Chinese Patent Application No. 201610496308.9, filed on Jun. 28, 2016, the entire contents of which are hereby incorporated by reference.

TECHNICAL FIELD

The present disclosure relates to an optical module for optical communication.

BACKGROUND

A printed circuit board (PCB) is an important component of an optical module, which may be used for electrically connecting chips.

A PCB may comprise a substrate as well as metal wires and solder pads which are formed on the substrate. A chip may be fixed on the PCB by welding pins thereof to the solder pads. The PCB with chips may be installed and fixed in a housing of the optical module by connecting devices. Since space in the housing is small, heat dissipation of the chips may be poor.

SUMMARY

In order to improve a heat dissipation effect on chips and overall structure utilization ratio of an optical module, the present disclosure provides following technical solutions.

According to a first aspect of the present disclosure, an optical module is provided, the optical module may comprise: a housing; two or more circuit board layers disposed in the housing and electrically connected to each other; and a light emitting chip electrically connected to at least one of the circuit board layers.

According to a second aspect of the present disclosure, an optical module is provided, the optical module may comprise: a housing; a first rigid circuit board layer in the housing; a second circuit board layer disposed in the housing comprising a first substrate and a first flexible circuit board configured on the first substrate and electrically connected with the first circuit board layer; and a light emitting chip electrically connected to the second circuit board layer and located in a cavity formed by the first circuit board layer and the second circuit board layer.

According to a third aspect of the present disclosure, an optical module is provided, the optical module may comprise: a housing; a laminated structure formed by folding a flexible circuit board, wherein the flexible circuit board comprises a first side with a circuit and a second side without any circuit, and a metal substrate is disposed between two adjacent layers of the folded laminated structure facing each other with the second side; and a light emitting chip electrically connected to the flexible circuit board.

According to another aspect of the present disclosure, an optical module is provided. The optical module may comprise: a housing; two or more circuit board layers disposed in the housing and electrically connected to each other via a first flexible circuit board; and a light emitting chip electrically connected to at least one of the circuit board layers, wherein at least one of the circuit board layer is a rigid circuit board; at least one of the circuit board layer comprises a metal substrate at least partially in direct thermal contact with the housing and a second flexible circuit board disposed on the metal substrate and having a through hole; and the metal substrate comprises a lug boss passing the through hole of the second flexible circuit board and contacting with the light emitting chip in at least one of contact modes of: direct contact, and contact via a heat conductive structure.

In embodiments in accordance with the present disclosure, two or more circuit board layers may be configured in an optical module. On the heat dissipation basis of the circuit board layers themselves, the circuit board layers may be disposed to be in contact with a housing of the optical module to improve heat dissipation. A light emitting chip may be disposed to be in contact with a lug boss or a heat conductive structure to improve heat dissipation. In this way, multiple heat dissipation channels for the light emitting chip may be provided. Therefore, heat dissipation of the light emitting chip may be effectively improved in the present disclosure. Furthermore, the circuit board layers may be superposed in a direction vertical to the circuit board layers, and a plurality of circuit boards may be configured on a same layer, thereby effectively expanding an available area of each of the circuit board layers, and improving overall space utilization of the optical module.

The details of one or more embodiments of the subject matter described in the present disclosure are set forth in the accompanying drawings and description below. Other features, aspects, and advantages of the subject matter will become apparent from the description, the drawings, and the claims. Features of the present disclosure are illustrated by way of example and not limited in the following figures, in which like numerals indicate like elements.

DETAILED DESCRIPTION

Figure 1:
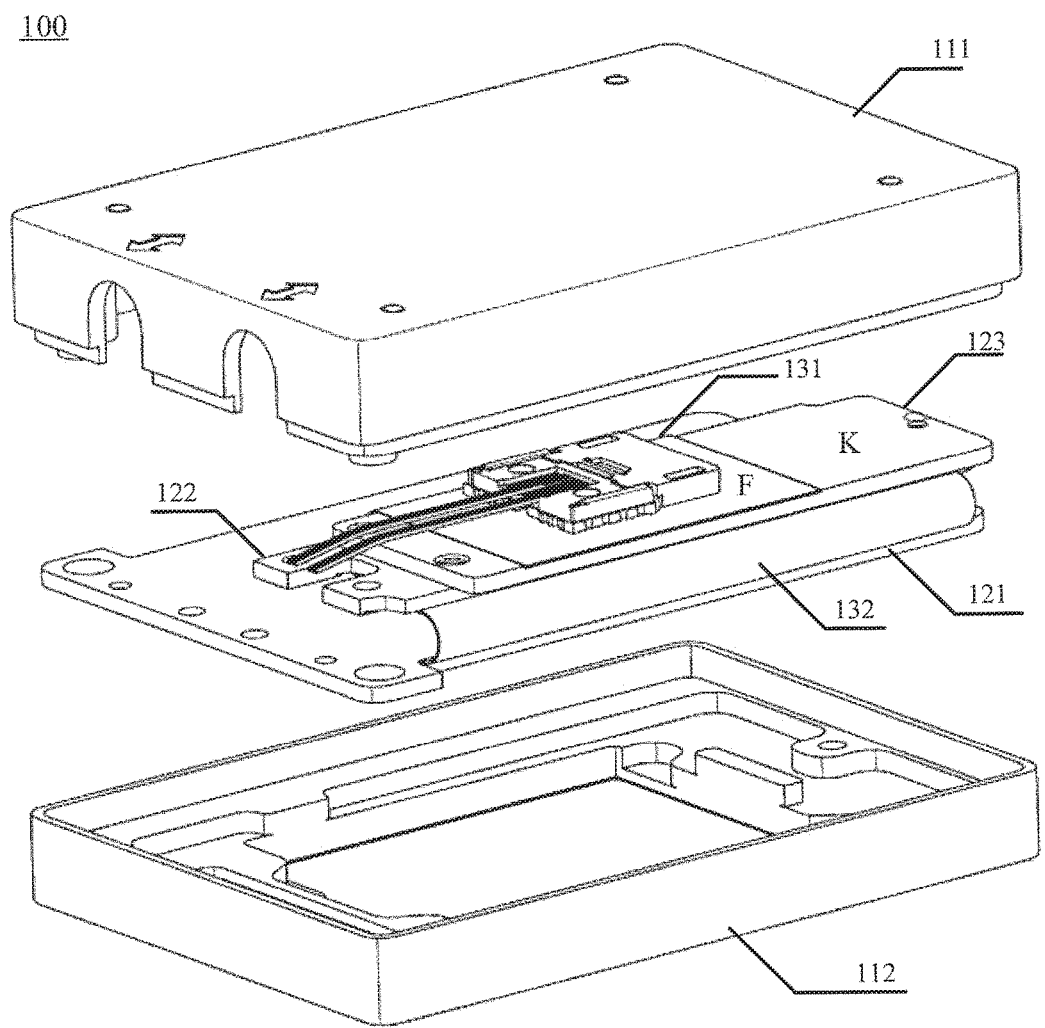
FIG. 1 is a structural schematic view of an optical module according to an embodiment of the present disclosure.

FIG. 1 is a structural schematic view of an optical module according to an embodiment of the present disclosure. As shown in FIG. 1, the optical module may comprise a housing comprising an upper housing 111 and a lower housing 112, a first circuit board layer 121, a second circuit board layer 122, a third circuit board layer 123 and a light emitting chip (not shown in FIG. 1). The first circuit board layer 121, the second circuit board layer 122, and the third circuit board layer 123 may be disposed within space enclosed by the upper housing 111 and lower housing 112.

The first circuit board layer 121 may be a rigid circuit board. The rigid circuit board may comprise a hard laminated board and conductive paths thereon. For example, the rigid circuit board may be a hard PCB. The second circuit board layer 122 may comprise a first substrate 1221 (not shown in FIG. 1) and a first flexible circuit board 1222 (not shown in FIG. 1) covered on the first substrate 1221. The third circuit board layer 123 may comprise a second substrate 1231 (not shown in FIG. 1) and a second flexible circuit board 1232 (not shown in FIG. 1) covered on the second substrate 1231. The first substrate 1221 and/or the second substrate 1231 may be disposed to be in contact with the upper housing 111. A circuit of the second circuit board layer 122 may be electrically connected to a circuit of the third circuit board layer 123 via a third flexible circuit board 131. The first substrate 1221 may be disposed to be in contact with the second substrate 1231, or the first substrate 1221 may be disposed to not be in contact with the second substrate 1231. The circuit of the second circuit board layer 122 may be electrically connected to a circuit of the first circuit board layer 121. The second circuit board layer 122 may be disposed not to be in contact with the first circuit board layer 121. The third flexible circuit board 131 may comprise a polyimide film and conductive paths thereon.

In an embodiment in accordance with the present disclosure, since three circuit board layers are included in the optical module, on the heat dissipation basis of the three circuit board layers themselves, the first substrate and/or second substrate may be disposed to be in contact with the upper housing 111 for dissipating heat. Therefore, a plurality of heat dissipation channels may be provided for the light emitting chip, and a heat dissipation effect of the light emitting chip may be effectively improved.

Figure 2:
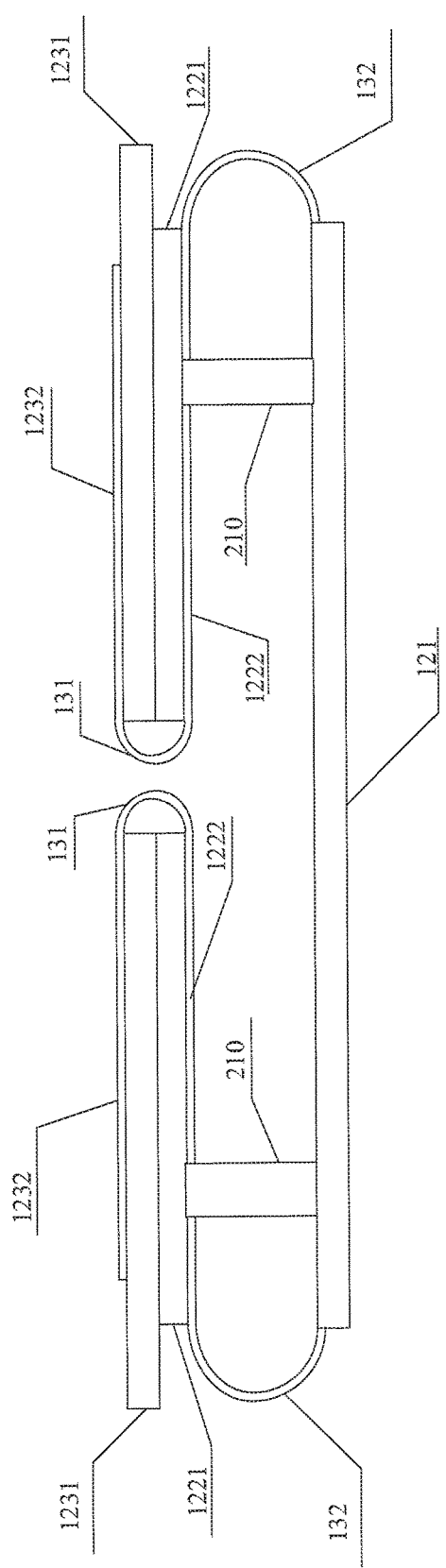
FIG. 2 is a structural schematic view of a part of an optical module according to an embodiment of the present disclosure.

According to an example, with reference to FIG. 1 and FIG. 2, the third circuit board layer 123 may be closer to the inner wall of the upper housing 111 than the second circuit board layer 122. A side of the second substrate 1231 disposed with the second flexible circuit board 1232 may comprise a coverage area F and an idle area K. The coverage area F may be configured to be covered with the second flexible circuit board 1232. Remaining area on the side except the coverage area may be the idle area K. For example, the idle area K may be an area without being configured to be covered with the second flexible circuit board 1232 and at least a part of the idle area K may be disposed to be in contact with the upper housing 111 of the optical module. The idle area K may be disposed to be directly or indirectly in contact with the upper housing 111. Indirect contacting between the idle area K and the upper housing 111 may be realized by a heat conductive structure or a heat conductive adhesive such as silver adhesive, heat conductive silicon grease and the like. Therefore, electricity leakage may be avoided, and effective heat dissipation of the second circuit board layer 122 and the third circuit board layer 123 may be realized.

In an embodiment in accordance with the present disclosure, the second substrate 1231 may be disposed to be directly in contact with the upper housing 111, which may provide efficient heat dissipation. The second substrate 1231 may also be disposed to be indirectly in contact with the upper housing 111 through a heat conductive adhesive or a heat conductive structure. When the heat conductive structure is a metal sheet or a metal column, a good heat dissipation may also be ensured. Furthermore, a side of the first substrate 1221 disposed with the first flexible circuit board 1222 may also comprise a coverage area and an idle area. The idle area of the first substrate 1221 may also be disposed to be in contact with the upper housing 111 of the optical module, which will not be described in detail in embodiments in accordance with the disclosure. The second circuit board layer 122 may be disposed to be not in contact with the first circuit board layer 121. Specifically, the second circuit board layer 122 and the first circuit board layer 121 may be disposed to be not in contact with each other directly. For example, the two circuit board layers may be parallel to each other and separated by a certain space.

It may be noted that the circuit of the second circuit board layer 122 may be electrically connected to the circuit of the first circuit board layer 121 by a plurality of manners, e.g. via a fourth flexible circuit board 132.

As shown in FIG. 2, when the second circuit board layer 122 is closer to the first circuit board layer 121 than the third circuit board layer 123, one or more support columns 210 may be disposed between the first circuit board layer 121 and the second circuit board layer 122. A number of support columns may be adjusted according to a practical application scenario. Here, a support column 210 may be taken as an example. Two ends of the support column 210 may be affixed to the first circuit board layer 121 and the second circuit board layer 122 respectively.

The first circuit board layer 121 may be affixed on the lower housing 112. The support column 210 may be affixed to the housing 112 and passed through the first circuit board layer 121 and the second circuit board layer 122. The support column 210 may also be affixed to the first circuit board layer 121 for supporting the second circuit board layer 122 and the third circuit board layer 123. In this way, the second circuit board layer 122 may be disposed to be not in contact with the first circuit board layer 121, and a cavity for accommodating the light emitting chip may be formed between the second circuit board layer 122 and the first circuit board layer 121. The circuit of the second circuit board layer 122 may be electrically connected to the circuit of the first circuit board layer 121 via the fourth flexible circuit board 132. The fourth flexible circuit board 132 may comprise a polyimide film and conductive paths formed thereon.

Figure 3:
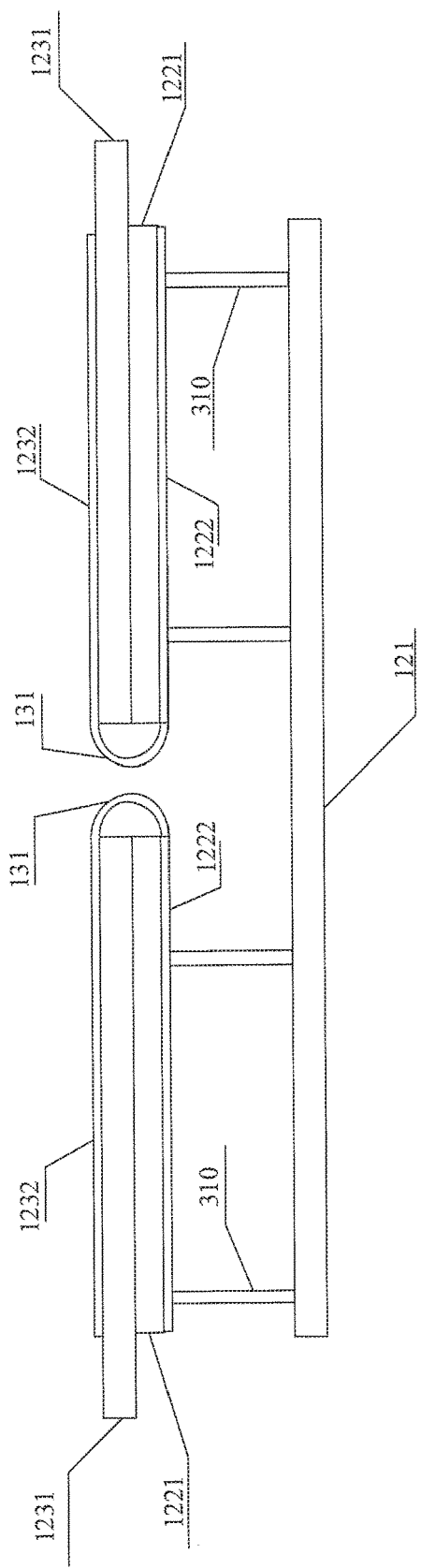
FIG. 3 is a structural schematic view of a part of an optical module according to another embodiment of the present disclosure.

For example, in an embodiment, as shown in FIG. 3, the circuit of the second circuit board layer 122 may be electrically connected to the circuit of the first circuit board layer 121 via one or more conductive pins.

With reference to FIG. 3, when the second circuit board layer 122 is closer to the first circuit board layer 121 than the third circuit board layer 123, the circuit of the first circuit board layer 121 may be disposed to face the circuit of the second circuit board layer 122. Here, a conductive pin 310 may be taken as an example. The conductive pin 310 may be disposed between the first circuit board layer 121 and the second circuit board layer 122. Two ends of the conductive pin 310 may be affixed to the first circuit board layer 121 and the second circuit board layer 122 respectively. A number of the conductive pins may be adjusted according to a practical application scenario so as to achieve a good heat conduction, which is not restricted by the present disclosure. Under normal conditions, the first circuit board layer 121 may be affixed to the lower housing 112. The conductive pin 310 may be affixed to the first circuit board layer 121, such that the second circuit board layer 122 may be disposed to be not in contact with the first circuit board layer 121, and a cavity for accommodating the light emitting chip may be formed between the second circuit board layer 122 and the first circuit board layer 121.

In FIG. 3, the circuit of the second circuit board layer 122 may be electrically connected to the circuit of the first circuit board layer 121 via the conductive pin 310. The conductive pin 310 may be made from a metal material. It may be noted that in order to guarantee an electric conductivity of the conductive pin 310, the first substrate 1221 may be made from a resin when the first circuit board layer 121 is electrically connected to the second circuit board layer 122 via the conductive pin 310.

In a practical application scenario, the circuit of the second circuit board layer 122 may be electrically connected to the circuit of the first circuit board layer 121 via other structures similar to the conductive pin 310. The other structures may be conductive, e.g. an electric connector, and installation position thereof may refer to the conductive pin 310 in FIG. 3, which will not be described in details in the disclosure.

In an embodiment in accordance with the present disclosure, as shown in any one of FIGS. 1-3, the optical module may comprise a first circuit board layer, a second circuit board layer and a third circuit board layer, providing a total of three circuit board layers. Furthermore, the first substrate 1221 may be covered with the first flexible circuit board 1222; the second substrate 1231 may be covered with the second flexible circuit board 1232; and the first circuit board layer 121 may be disposed with a circuit thereon. Therefore, the light emitting chip may be electrically connected to any one circuit board layer. For example, an optical assembly such as the light emitting chip may be disposed on the first circuit board layer 121, the first flexible circuit board 1222 and the second flexible circuit board 1232. Hence, an available area of each of the circuit board layers may be effectively expanded by superposing the circuit board layers in a direction vertical to the circuit board layers. Optical assemblies may be disposed on the available areas of each of the circuit board layers. Therefore, more circuit boards and light emitting chips may be disposed in the optical module provided by embodiments in accordance with the present disclosure, thereby improving overall space utilization of the optical module.

Figure 4:
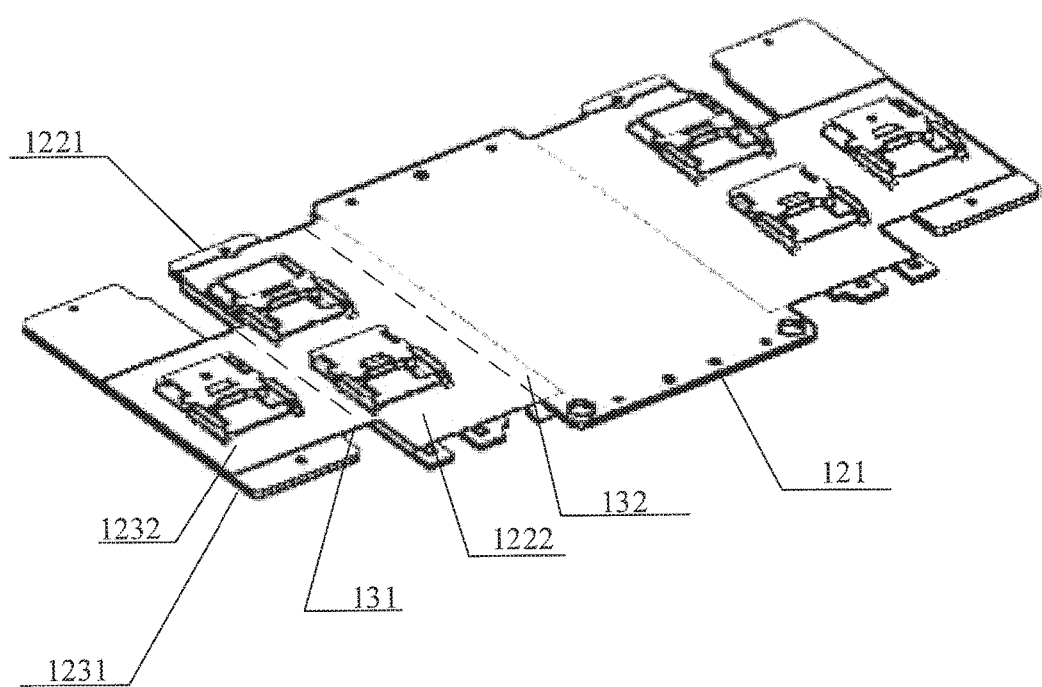
FIG. 4 is a structural schematic expanded view of first, second and third circuit board layers according to an embodiment of the present disclosure.

An installation of internal structures may be convenient and flexible by adopting the optical module provided by embodiments of the present disclosure. FIG. 4 is a structural schematic of an unfolded view of the first circuit board layer, second circuit board layer and third circuit board layer according to an embodiment of the present disclosure. In FIG. 4, the circuit of the second circuit board layer may be electrically connected to the circuit of the first circuit board layer via the fourth flexible circuit board 132. As shown in FIG. 4, the third flexible circuit board 131 and the fourth flexible circuit board 132 may be respectively located in two sides (left and right sides of the second circuit board layer 122 in FIG. 4) of the second circuit board layer 122. When in assembly, a first side of the first substrate 1221 covered with the first flexible circuit board 1222 may be turned over to a side adjacent to the first circuit board layer 121 (e.g., an outward direction perpendicular to the paper in FIG. 4), and a second side of the second substrate 1231 not covered with the second flexible circuit board 1232 may be turned over to a side adjacent to the second circuit board layer 122 (e.g., an inward direction perpendicular to the paper in FIG. 4). In this way, a second side of the first substrate 1221 not covered with the first flexible circuit board 1222 may be disposed to be in contact with the second side of the second substrate 1231 not covered with the second flexible circuit board 1232. Therefore, the first substrate 1221 and the second substrate 1231 may be in contact and effective heat conduction between them may be realized by, for example, coating a heat conductive adhesive such as silver adhesive, heat conductive silicon grease and the like on the contacted side/surface.

Figure 5:
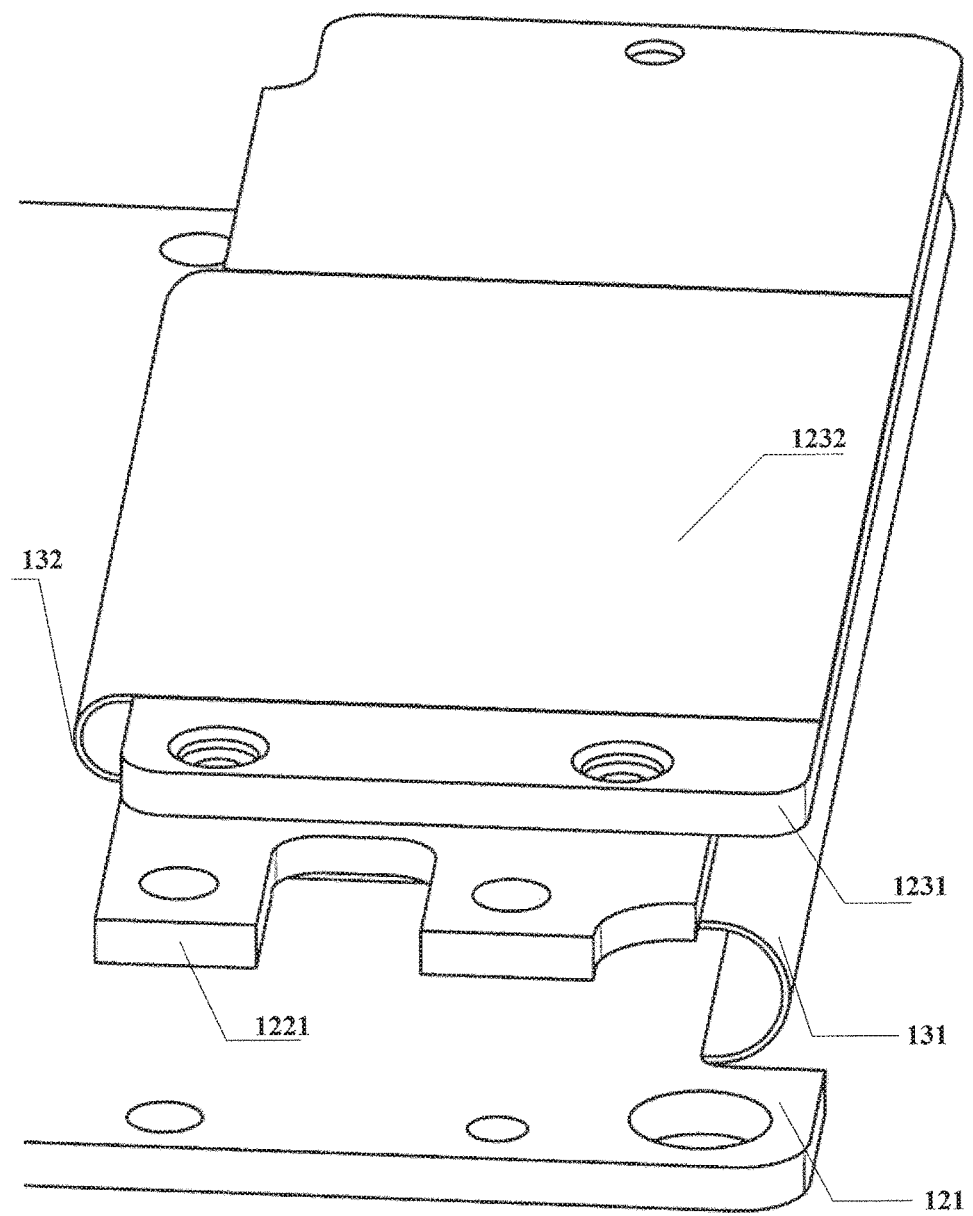
FIG. 5 is a structural schematic view of a part of an optical module according to still another embodiment of the present disclosure.

In an embodiment, the structure and material of the third flexible circuit board 131 and the fourth flexible circuit board 132 may be the same with those of the first flexible circuit board 1222 and the second flexible circuit board 1232. For example, the third flexible circuit board 131, the fourth flexible circuit board 132, the first flexible circuit board 1222 and the second flexible circuit board 1232 may be of one piece, such that a flexible circuit board may be integrally formed, thereby simplifying manufacturing process. Furthermore, one laminated structure as shown in FIG. 5 comprising the first circuit board layer 121, the second circuit board layer 122 (e.g., the first substrate 1221 and the first flexible circuit board 1222 (not shown in FIG. 5) disposed on the first substrate 1221) and the third circuit board layer 123 (e.g., the second substrate 1231 and the second flexible circuit board 1232 disposed on the second substrate 1231) may be formed through a simple folding. Moreover, when the third flexible circuit board 131, the fourth flexible circuit board 132, the first flexible circuit board 1222 and the second flexible circuit board 1232 are of one piece, the circuits on the three circuit board layers may be connected more smoothly, and signal transmission efficiency may be higher. In order to achieve a better heat dissipation effect, the material of the first substrate 1221 and the second substrate 1231 may be copper, aluminium or other metals. One of the substrates and one of the flexible circuit boards may be correspondingly connected in an electrically insulated manner, for example, the first substrate 1221 and the first flexible circuit board 1222 may be connected in an electrically insulated manner.

In practical applications, there may be a plurality of circuit board layers substantively arranged in parallel in a direction vertical to the circuit board layers. For example, as shown in FIG. 2, assuming that the first circuit board layer is a rigid circuit board, the optical module may comprise two flexible circuit boards symmetrically disposed on the left and right sides of the first circuit board layer 121. The two flexible circuit boards may be respectively connected to the second circuit board layer 122 and the third circuit board layer 123. In this way, the optical module may comprise two second circuit board layers 122 and two third circuit board layers 123. Furthermore, each of the flexible circuit boards may be of one piece formed by the first flexible circuit board 1222, the second flexible circuit board 1232, the third flexible circuit board 131 and the fourth flexible circuit board 132.

In an embodiment in accordance with the present disclosure, the optical module may further comprise a plurality of circuit boards which may be disposed on a same layer. For example, the second circuit board layer may comprise two circuit boards, three circuit boards or more. The third circuit board layer may also comprise two circuit boards, three circuit boards or more.

In an embodiment, the first circuit board layer 121 may comprise a third substrate and a flexible circuit board disposed on the third substrate. The flexible circuit board disposed on the third substrate may respectively extend a preset distance toward the left and right sides of the first circuit board layer 121. As a result, an extending part of the flexible circuit board disposed on the left and right sides of the first circuit board layer 121 may be respectively connected to one or more circuit board layers in a direction vertical to the circuit board layers. In this case, the optical module may comprise one complete flexible circuit board.

In an optical module provided by embodiments in accordance with the present disclosure, orthographic projections of the second circuit board layer 122 and the third circuit board layer 123 on the first circuit board layer 121 may be both located within the boundary of the first circuit board layer 121. In this way, a size of each of the circuit board layers in a horizontal plane may be effectively reduced, and when the size of each of the circuit board layers is matched with the size of the housing, utilization of the available area may be maximized.

Figure 6:
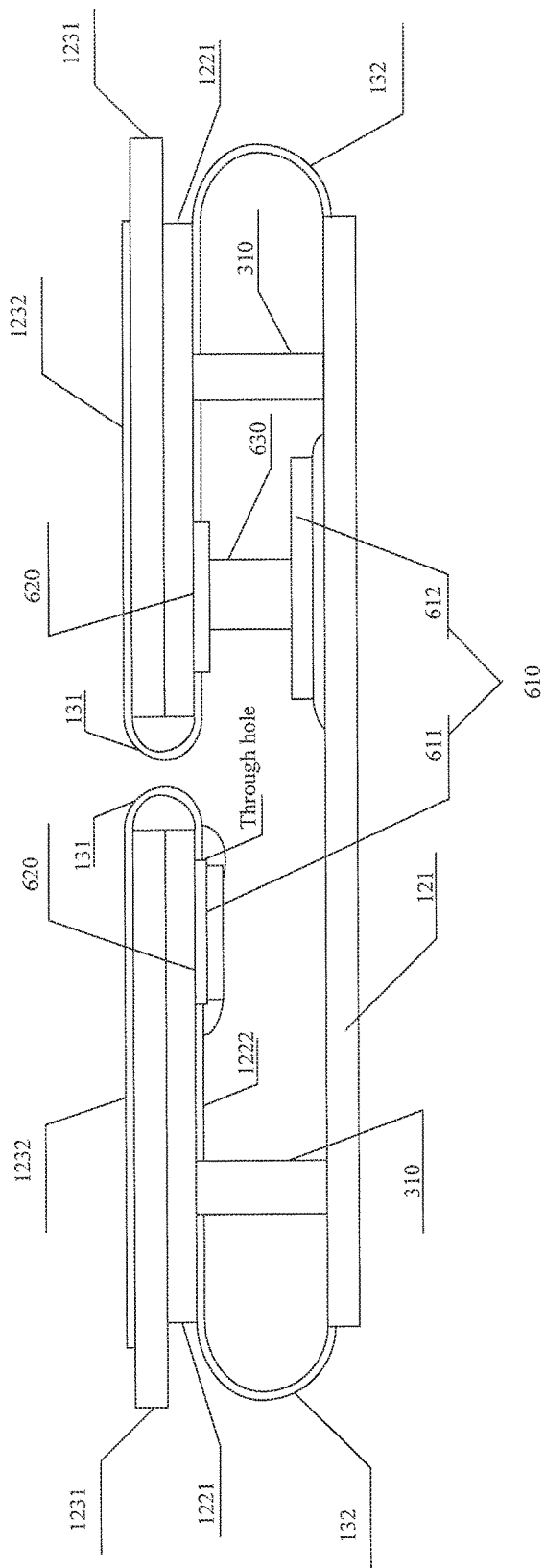
FIG. 6 is a structural schematic view of a part of an optical module according to still another embodiment of the present disclosure.

In an embodiment, FIG. 6 is a structural schematic view of a part of the optical module according to still another embodiment of the present disclosure. As shown in FIG. 6, the first flexible circuit board 1222, the second flexible circuit board 1232, the third flexible circuit board 131 and the fourth flexible circuit board 132 may be of one piece. With respect to chips 610, a first chip 611 and a second chip 612 are illustrated as an example in FIG. 6. The first chip 611 may be a light emitting chip. Lug bosses 620 may be disposed on the first side of the first substrate 1221 (e.g., the side covered with the first flexible circuit board 1222). The thickness of the lug bosses 620 may be greater than or equal to that of the first flexible circuit board 1222, and the material thereof may be the same with that of the first substrate 1221. The first flexible circuit board 1222 may comprise one or more through holes (not shown in FIG. 6) through which the lug bosses 620 pass. The chips 610 may be disposed to be in contact with the lug bosses 620 directly or indirectly, such as, via a heat conductive structure or a heat conductive adhesive such as silver adhesive, heat conductive silica gel and the like, so as to further improve the heat dissipation of the chips 610.

As shown in FIG. 6, a back side (e.g., a side disposed without any circuit) of the first chip 611 may be attached to the top of one of the lug bosses 620 via a heat conductive adhesive such as silver adhesive, heat conductive silica gel and the like. Or the back side of the first chip 611 may be disposed to be directly in contact with the top of one of the lug bosses 620. A pin of the first chip 611 may be electrically connected to the circuit of the second circuit board layer 122. The first chip 611 may be electrically connected to the circuit of the second circuit board layer 122 by welding an SMT (Surface Mounted Technology) patch or a metal wire. When the first substrate 1221 is disposed to be in contact with the second substrate 1231, the first chip 611 may be electrically connected to the circuit of the second circuit board layer 122, preferably, via a metal conductor. When the first circuit board layer is a hard PCB, a back side (e.g., the side without any circuit) of the second chip 612 may also be in contact with the top of the lug bosses 620 via a heat conductive structure 630. A pin of the second chip 612 may be connected with a solder pad on the first circuit board layer 121, thereby ensuring the second chip 612 to have a better heat dissipation effect.

In addition, the lug bosses 620 may also be disposed on the first side of the second substrate 1231 (e.g., the side disposed with the second flexible circuit board 1232), thickness of the lug bosses 620 may be greater than or equal to that of the second flexible circuit board 1232, and the material thereof may be the same with that of the second substrate 1231. The first flexible circuit board 1222 may comprise one or more through holes through which the lug bosses 620 pass. The chips 610 may be disposed to be in contact with the lug bosses 620 directly or indirectly, so as to further improve the heat dissipation of the chips 610.

Figure 7:
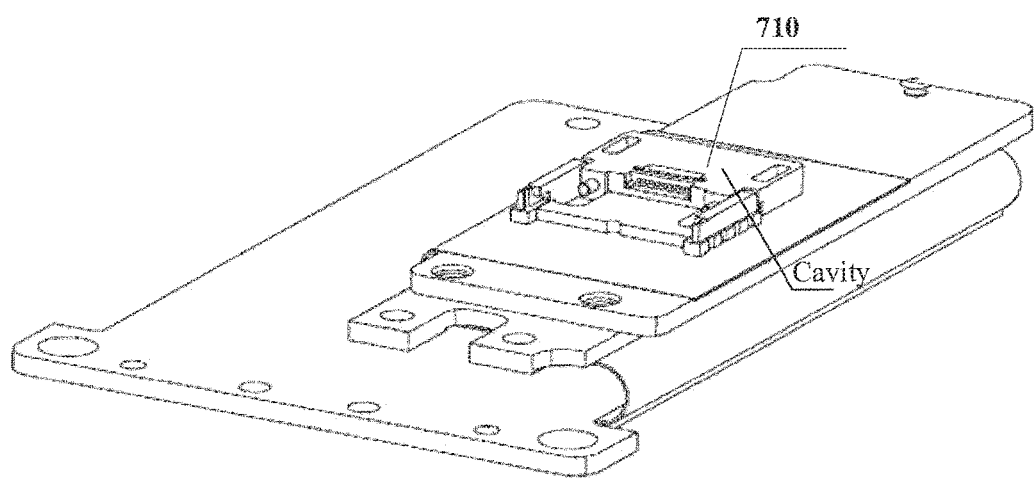
FIG. 7 is a structural schematic view of a part of an optical module according to still another embodiment of the present disclosure.

In an embodiment, as shown in FIG. 7, the optical module may further comprise a lens assembly 710 corresponding to a light emitting chip. The lens assembly may provide a light path for the light emitting chip. A cavity may be formed by the lens assembly 710 corresponding to the light emitting chip and one of the circuit board layers comprising the light emitting chip. For example, the light emitting chip 611 (not shown in FIG. 7) may be located in the cavity.

Figure 8:
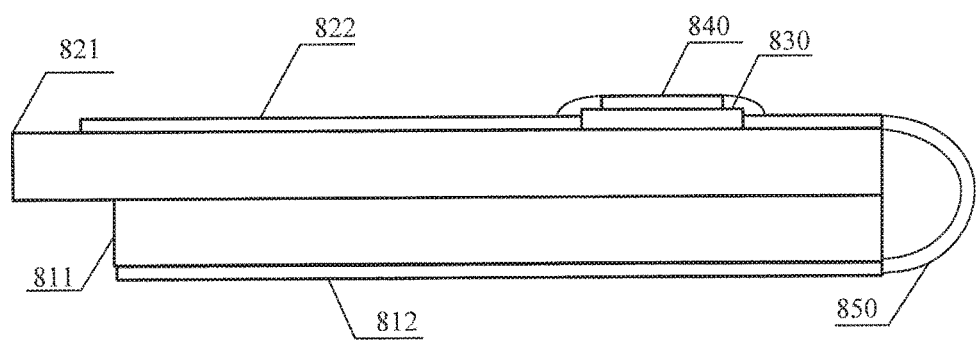
FIG. 8 is a structural schematic view of a part of an optical module according to still another embodiment of the present disclosure.

FIG. 8 is a structural schematic view of a part of an optical module according to still another embodiment of the present disclosure. In this embodiment, the optical module may comprise a first circuit board layer (comprising a first metal substrate 811 and a first flexible circuit board 812 disposed on the first metal substrate 811), a second circuit board layer (comprising a second metal substrate 821 and a second flexible circuit board 822 disposed on the second metal substrate 821), and one or more light emitting chips. Here, a light emitting chip 840 may be taken as an example as shown in FIG. 8. The first circuit board layer may be electrically connected to the second circuit board layer through a third flexible circuit board 850. The first flexible circuit board 812, the second flexible circuit board 822 and the third flexible circuit board 850 may be of one piece. The first metal substrate 811 and/or the second metal substrate 821 may be disposed with one or more lug bosses. Here a lug boss 830 may be taken as an example. The thickness of the lug boss 830 may be greater than or equal to that of the second flexible circuit board 822, and the lug boss 830 may also be made from a metal, or may be integrally formed with the metal substrates. Pins of the light emitting chip 840 may be electrically connected to the second circuit board layer via a metal wire. And a back side of the light emitting chip 840 may be attached to the top of the lug boss 830 via a heat conductive adhesive such as silver adhesive, heat conductive silica gel and the like.

Figure 9:
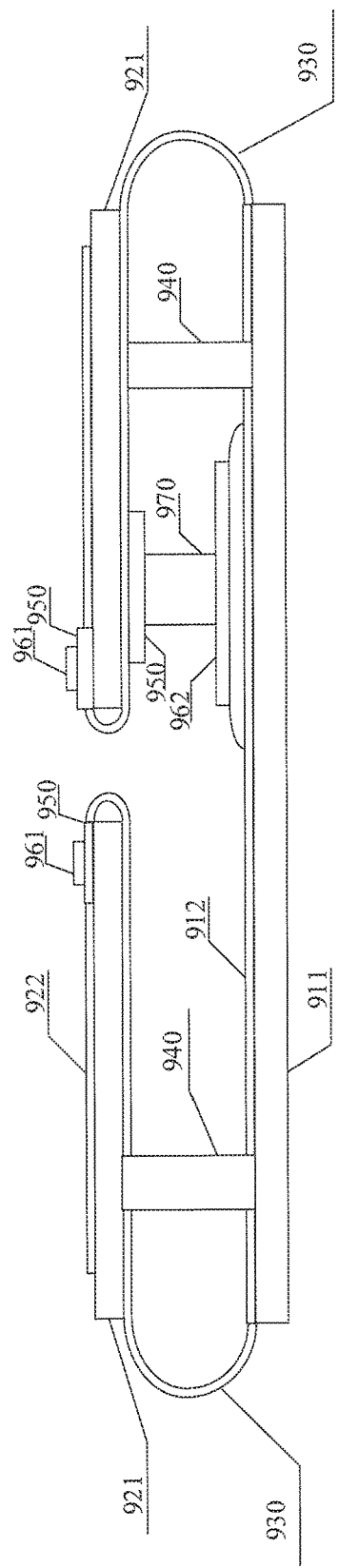
FIG. 9 is a structural schematic view of a part of an optical module according to still another embodiment of the present disclosure.

FIG. 9 is a structural schematic view of a part of an optical module according to still another embodiment of the present disclosure. In an embodiment, the optical module may comprise a first circuit board layer (comprising a first metal substrate 911 and a first flexible circuit board 912 disposed on the first metal substrate 911), a second circuit board layer (comprising a second metal substrate 921 and a second flexible circuit board 922 disposed on the second metal substrate 921), two first chips 961 and a second chip 962. The first circuit board layer may comprise the first metal substrate 911 and the first flexible circuit board 912 disposed on the first metal substrate 911; and the second circuit board layer may comprise the second metal substrate 921 and the second flexible circuit board 922 disposed on the second metal substrate 921. As shown in FIG. 9, the second flexible circuit board 922 on the second metal substrate 921 may be disposed on upper and lower sides of the second metal substrate 921, or may be disposed on one of the upper and lower sides only. The first circuit board layer and the second circuit board layer may be electrically connected to each other via a third flexible circuit board 930. Support columns 940 may be disposed on a housing of the optical module or on the first circuit board layer, so as to support the second circuit board layer. A number of the support columns may be adjusted according to practical situation. One or more, three, for example, lug bosses 950 may be disposed on both the first metal substrate 911 and the second metal substrate 921. One of the first chips 961 may be a light emitting chip, and may be attached to the top of one of the lug bosses 950 via a heat conductive adhesive such as silver adhesive, heat conductive silica gel and the like. And the second chip 962 may be disposed to be in contact with the top of one of the lug bosses 950 via a heat conductive structure 970.

It may be noted that in embodiments in accordance with the present disclosure, relative positions of each of the circuit board layers may be properly adjusted according to a practical situation, and the number of the chips may also be adjusted according to the practical situation. FIGS. 1-9 are only for exemplarily describing the present disclosure. Any structures obtained through a simple modification on the basis of structures provided by the present disclosure should be included in a protection scope of the present disclosure.

Of course, in embodiments in accordance with the present disclosure, all circuit board layers may be rigid circuit boards, and relative positions thereof may be properly adjusted according to a practical situation.

In embodiments in accordance with the present disclosure, two or more circuit board layers may be disposed in an optical module. On the heat dissipation basis of the circuit board layers themselves, the circuit board layers may be disposed to be in contact with the housing of the optical module to for dissipating heat. A light emitting chip may be disposed to be in contact with a lug boss or a heat conductive structure to dissipate heat, and multiple heat dissipation channels for the light emitting chip may be provided. Therefore, heat dissipation of the light emitting chip may be effectively improved in the present disclosure. Furthermore, the circuit board layers may be superposed in a direction vertical to the circuit board layers, and a plurality of circuit boards may be arranged on a same layer, thereby effectively expanding an available area of each of the circuit board layers, and improving overall spatial utilization of the optical module.

The term "and/or" in the present disclosure is only intended to describe an associative relationship of associated objects, and denotes three relationships. For example, A and/or B may denote following three relationships: A, A and B, and B. In addition, the character "/" in the text generally denotes that the former and latter associated objects are in an "or" relationship.

The above are only preferred examples of the present disclosure and are not intended to limit the disclosure. Any modification, equivalent replacement, or improvement within the spirit and principles of the present disclosure should be considered within the range of the disclosure.

It will be appreciated by persons of ordinary skill in the art that numerous variations and/or modifications may be made to the above-described embodiments, without departing from the broad general scope of the present disclosure. The present embodiments are, therefore, to be considered in all respects as illustrative and not restrictive.

The invention claimed is:

1. An optical module, comprising:
a housing;
a first circuit board layer disposed in the housing;
a second circuit board layer disposed in the housing and comprising a first substrate and a first flexible circuit board disposed on the first substrate, wherein the first flexible circuit board is electrically connected with the first circuit board layer;
a third circuit board layer disposed in the housing and comprising a second substrate and a second flexible circuit board disposed on the second substrate, wherein the second flexible circuit board is electrically connected with the first flexible circuit board via a third flexible circuit board; and
a light emitting chip electrically connected to at least one of the first, second and third circuit board layers.

2. The optical module according to claim 1, wherein the first circuit board layer comprises a rigid circuit board.

3. The optical module according to claim 1, wherein the first and second circuit board layers are electrically connected via a fourth flexible circuit board.

4. The optical module according to claim 3, wherein the first, second, third and fourth flexible circuit boards are of one piece.

5. The optical module according to claim 3, wherein,
the second circuit board layer is closer to the first circuit board layer than the third circuit board layer;
wherein the optical module further comprises:
one or more support columns between the first circuit board layer and the second circuit board layer.

6. The optical module according to claim 5, wherein,
the one or more support columns are disposed on the housing and passed through the first circuit board layer and the second circuit board layer.

7. The optical module according to claim 5, wherein,
the one or more support columns are disposed on the first circuit board layer.

8. The optical module according to claim 1, wherein,
the second circuit board layer is closer to the first circuit board layer than the third circuit board layer;
the first and second circuit board layers and electrically connected via one or more conductive pins; and
the first substrate is made from a resin.

9. The optical module according to claim 1, wherein the first substrate and the second substrate are made from a metal.

10. The optical module according to claim 1, wherein
a lug boss is formed on the first substrate;
the first flexible circuit board comprises a through hole through which the lug boss extrudes;
the lug boss is configured to be in contact with the light emitting chip in any one of following modes:
direct contacting, and
contacting via a heat conductive structure.

11. The optical module according to claim 1, wherein at least one of the first and second substrates is configured to be in contact with the housing in any one of following modes:
direct contacting, and
contacting via a heat conductive structure.

12. The optical module according to claim 1, wherein a side of the second substrate covered with the second flexible circuit board comprises:
a coverage area configured to be covered with the second flexible circuit board; and
an idle area except the coverage area, at least a part of the idle area is configured to be in contact with the housing in any one of following modes:
direct contacting, and
contacting via a heat conductive structure.

13. The optical module according to claim 1, wherein at least one of the second and third circuit board layers comprises a plurality of circuit boards configured on a same layer.

14. The optical module according to claim 13, wherein the second circuit board layer further comprises:
a third substrate parallel with the first circuit board layer, wherein a distance between the third substrate and the first circuit board layer is the same as a distance between the first substrate and the first circuit board layer;
a fifth flexible circuit board disposed on the third substrate;
wherein the third circuit board layer further comprises:
   a fourth substrate parallel with the first circuit board layer, wherein a distance between the fourth substrate and the first circuit board layer is the same as a distance between the second substrate and the first circuit board layer; and
   a sixth flexible circuit board disposed on the fourth substrate;
wherein the sixth flexible circuit board is electrically connected with the fifth flexible circuit board via a seventh flexible circuit board.

15. The optical module according to claim 14, wherein the fifth, sixth and seventh flexible circuit boards are of one piece.

16. The optical module according to claim 14, wherein a side of the third substrate opposite to the fifth flexible circuit board is in contact with a side of the fourth substrate opposite to the sixth flexible circuit board by a heat conductive adhesive.

17. The optical module according to claim 1, wherein the light emitting chip is located in a cavity which is formed by a lens assembly corresponding to the light emitting chip and one of the circuit board layers configured with the light emitting chip.

18. The optical module according to claim 1, wherein orthographic projections of the second and third circuit board layers on the first circuit board layer are partly located in the first circuit board layer.

19. The optical module according to claim 1, wherein a side of the first substrate opposite to the first flexible circuit board is in contact with a side of the second substrate opposite to the second flexible circuit board by a heat conductive adhesive.

20. The optical module according to claim 1, wherein the first, second and third flexible circuit boards are of one piece.

* * * * *